US008815620B2

(12) United States Patent
Park et al.

(10) Patent No.: US 8,815,620 B2
(45) Date of Patent: Aug. 26, 2014

(54) FLEXIBLE ORGANIC LIGHT-EMITTING DISPLAY DEVICE AND METHOD OF MANUFACTURING THE SAME

(71) Applicant: Samsung Display Co., Ltd., Yongin (KR)

(72) Inventors: Jae-Hyun Park, Yongin (KR); Jun-Hyuk Cheon, Yongin (KR); Dong-Min Lee, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/779,450

(22) Filed: Feb. 27, 2013

(65) Prior Publication Data

US 2014/0042399 A1 Feb. 13, 2014

(30) Foreign Application Priority Data

Aug. 7, 2012 (KR) .................. 10-2012-0086397

(51) Int. Cl.
*H01L 27/32* (2006.01)

(52) U.S. Cl.
USPC .......................................................... 438/34

(58) Field of Classification Search
CPC ............ H01L 27/3244; H01L 27/3202; H01L 27/3204; H01L 27/3206; H01L 27/3225; H01L 27/3241; H01L 51/56; H01L 51/5012
USPC .................... 438/34, 99; 257/88, 89
See application file for complete search history.

(56) References Cited

U.S. PATENT DOCUMENTS

| 8,264,144 | B2 * | 9/2012 | Oikawa et al. ................ 313/512 |
| 8,368,209 | B2 * | 2/2013 | Tuji et al. ...................... 257/724 |
| 2004/0233374 | A1 | 11/2004 | Yamazaki et al. |
| 2005/0266591 | A1 * | 12/2005 | Hideo ............................. 438/22 |
| 2006/0170077 | A1 * | 8/2006 | Aoki et al. ..................... 257/642 |
| 2007/0295973 | A1 * | 12/2007 | Jinbo et al. ...................... 257/88 |
| 2008/0062451 | A1 * | 3/2008 | Yamazaki ..................... 358/1.14 |
| 2008/0096366 | A1 * | 4/2008 | Aoki et al. .................... 438/455 |
| 2008/0239230 | A1 | 10/2008 | Yamazaki et al. |
| 2009/0266471 | A1 * | 10/2009 | Kim et al. ........................ 156/67 |
| 2009/0302456 | A1 * | 12/2009 | Oikawa et al. ................ 257/701 |
| 2010/0253886 | A1 | 10/2010 | Kim et al. |
| 2011/0068385 | A1 * | 3/2011 | Aoki et al. ..................... 257/314 |

(Continued)

FOREIGN PATENT DOCUMENTS

| CN | 102738078 A | * 10/2012 |
| KR | 1020090071716 | 7/2009 |

(Continued)

*Primary Examiner* — Michele Fan
(74) *Attorney, Agent, or Firm* — Robert E. Bushnell, Esq.

(57) ABSTRACT

In a flexible organic light-emitting display device and a method of manufacturing the same, a photolysis layer and an electrostaticity prevention layer are sequentially formed on a carrier substrate, a first flexible substrate is formed on the electrostaticity prevention layer, a display unit is formed on the first flexible substrate, the display unit is covered with the second flexible substrate, and light is irradiated so as to decompose the photolysis layer and to remove the carrier substrate. The formed flexible organic light-emitting display device may have improved flexibility because a flexible substrate is used instead of a typical strong and thick glass substrate. In addition, occurrence of electrostaticity during the separation of the carrier substrate is suppressed by the electrostaticity prevention layer, and thus, damage of the display unit due to electrical impacts is also reduced.

9 Claims, 6 Drawing Sheets

(56) References Cited

U.S. PATENT DOCUMENTS

| | | |
|---|---|---|
| 2011/0092006 A1 | 4/2011 | An et al. |
| 2011/0124183 A1* | 5/2011 | Yasumatsu .................... 438/479 |
| 2011/0163456 A1* | 7/2011 | Miyasaka et al. ............. 257/773 |
| 2011/0312118 A1* | 12/2011 | Izumi et al. ...................... 438/52 |
| 2012/0001181 A1* | 1/2012 | Aoki et al. ........................ 257/57 |
| 2012/0108014 A1* | 5/2012 | Goto et al. ..................... 438/125 |
| 2012/0119339 A1* | 5/2012 | Oikawa et al. ................. 257/659 |
| 2012/0161197 A1* | 6/2012 | Im et al. ......................... 257/100 |
| 2013/0001544 A1* | 1/2013 | Yamazaki ........................ 257/43 |
| 2013/0149816 A1* | 6/2013 | Oikawa et al. ................. 438/117 |
| 2013/0308076 A1* | 11/2013 | Yasumatsu ....................... 349/84 |
| 2014/0059850 A1* | 3/2014 | Zhou ................................ 29/832 |

FOREIGN PATENT DOCUMENTS

| | | | |
|---|---|---|---|
| KR | 2009102065 A | * | 9/2009 |
| KR | 1020090102065 | | 9/2009 |
| KR | 1020110043374 | | 4/2011 |
| KR | 1020120018701 | | 3/2012 |

* cited by examiner

Laser

FLEXIBLE ORGANIC LIGHT-EMITTING DISPLAY DEVICE AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on the 7 Aug. 2012 and there duly assigned Serial No. 10-2012-0086397.

BACKGROUND OF THE INVENTION

1. Field of the Invention

The present invention relates to a flexible organic light-emitting display device and a method of manufacturing the same, and in particular, to a flexible organic light-emitting display device that is improved so that, when a carrier substrate is separated from a thin film layer, the display unit is not damaged in the manufacturing procedure, and a method of manufacturing the same.

2. Description of the Related Art

Organic light-emitting display devices can be manufactured as thin and flexible devices due to their driving characteristics, and much research into organic light-emitting display devices is being performed.

However, a display unit of an organic light-emitting display device may deteriorate due to permeation of water molecules. Accordingly, to prevent the permeation of external water molecules, a sealing structure for sealing the display unit is required.

Typically, as the sealing structure, a glass substrate with a display unit thereon is covered by a sealing substrate formed of the same glass material as in the glass substrate, and a space formed between the glass substrate and the sealing substrate is sealed by a sealant. That is, a sealant, such as an ultraviolet hardener, is coated on a peripheral region of a display unit of a thick and strong glass substrate, and then, the resultant structure is covered by a thick and strong sealing substrate, followed by irradiation of ultraviolet light to harden the sealant, thereby sealing.

However, such a typical sealing structure may not satisfy flexible bending characteristics which are recently required for organic light-emitting display devices. That is, recently, there is a demand for a flexible organic light-emitting display device with flexibility that is installed, even in a bending state. However, when the thick and strong glass substrate and the sealing substrate are used, such a demand may not be satisfied.

Accordingly, to solve the problem, a thin film sealing structure using, instead of a glass substrate, a thin film layer formed of, for example, a polymer, has been disclosed. In detail, forming a display unit on a glass substrate and forming a thin film layer covering upper and lower portions of the display unit are respectively performed, and then, the glass substrate is separated from the resultant structure, thereby enabling sealing of the thin film layer with respect to the display unit. That is, the glass substrate functions as only a carrier substrate in the manufacturing procedure.

However, the problem in this regard is that, when the glass substrate is separated from the thin film layer to manufacture such a thin film sealing structure, several kV or more of electrostaticity frequently occurs on the separation surface. In this case, the display unit may be highly likely to be damaged due to electrostaticity. Accordingly, there is a need to prevent this problem.

SUMMARY OF THE INVENTION

Embodiments of the present invention provide a flexible organic light-emitting display device that has a flexible thin film sealing structure and is improved so that damage of a display unit due to electrostaticity is reduced, and a method of manufacturing the flexible organic light-emitting display device.

According to an aspect of the present invention, there is provided a flexible organic light-emitting display device including: a first flexible substrate; a display unit formed on a surface of the first flexible substrate; an electrostaticity prevention layer formed on another surface of the first flexible substrate; and a second flexible substrate covering the display unit.

The electrostaticity prevention layer may include a crystalline ITO layer, and the crystalline ITO layer may have a thickness of 200 nm or less.

The first flexible substrate may include a first polymer layer and a first barrier layer which are sequentially stacked, and the second flexible substrate may include a second barrier layer and a second polymer layer which are sequentially stacked.

The first flexible substrate may include a glass substrate having a thickness of 0.1 mm or less, and the second flexible substrate may include a barrier layer and a polymer layer sequentially stacked.

According to another aspect of the present invention, there is provided a method of manufacturing a flexible organic light-emitting display device, the method including: sequentially forming a photolysis layer and an electrostaticity prevention layer on a carrier substrate; forming a first flexible substrate on the electrostaticity prevention layer; forming a display unit on the first flexible substrate; covering the display unit with the second flexible substrate; and, irradiating light to decompose the photolysis layer and to remove the carrier substrate.

The photolysis layer may include a polyimide layer, and the polyimide layer may have a thickness of 100 nm or less.

The electrostaticity prevention layer may include an ITO layer, and the ITO layer may have a thickness of 200 nm or less.

Before the irradiating of light, the ITO layer may be an amorphous ITO layer, and after the irradiating of light, the ITO layer may turn into a crystalline ITO layer.

The first flexible substrate may include a first polymer layer and a first barrier layer which are sequentially stacked, and the second flexible substrate may include a second barrier layer and a second polymer layer which are sequentially stacked.

The first flexible substrate may include a glass substrate having a thickness of 0.1 mm or less, and the second flexible substrate may include a barrier layer and a polymer layer which are sequentially stacked.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Expressions such as "at least one of," when preceding a list of elements, modify the entire list of elements and do not modify the individual elements of the list.

Hereinafter, embodiments of the present invention are described in detail with reference to the attached drawings.

Figure 1:
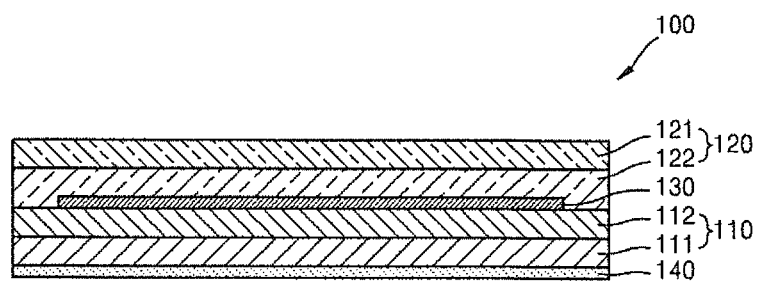
FIG. 1 is a cross-sectional view of a flexible organic light-emitting display device according to an embodiment of the present invention.

FIG. 1 is a cross-sectional view of a flexible organic light-emitting display device according to an embodiment of the present invention. In the present embodiment, the flexible organic light-emitting display device is a top emission type display device.

As illustrated in FIG. 1, the flexible organic light-emitting display device 100 according to the present embodiment includes a first flexible substrate 110 including a first polymer layer 111 and a first barrier layer 112, a display unit 130 including, for example, a thin film transistor (not shown) and an emission layer (not shown), a second flexible substrate 120 including a second barrier layer 122 and a second polymer layer 121, which are sequentially stacked in this order. That is, instead of a thick and strong glass substrate, the first and second flexible substrates 110 and 120, respectively, including the polymer layers 111 and 121, respectively, and the barrier layers 112 and 122, respectively, are used to seal the display unit 130, thereby embodying a sealing structure.

An electrostaticity prevention layer 140 is formed on an outer surface of the first flexible substrate 110. The electrostaticity prevention layer 140 is a crystalline ITO layer having low resistance, and the electrostaticity prevention layer 140 prevents the display unit 130 from being exposed to electrostaticity impacts. Originally, the electrostaticity prevention layer 140 is an amorphous ITO layer. However, when the electrostaticity prevention layer 140 absorbs light irradiated in the manufacturing procedure, the electrostaticity prevention layer 140 turned into crystalline with low resistance. This process will be described in detail later.

In addition, the first polymer layer 111 of the first flexible substrate 110 may be formed of heat-resistant polyimide having a glass transition temperature of 500° C. or more, and the heat-resistant polyimide may be formed by polymerizing BPDA-biphenyl-tetracarboxylic acid dianhydride (3,3',4,4'-biphenyl tetracarboxylic dianhydride) and p-phenylenediamine (PDA). A thickness of the first polymer layer 111 may be in a range of about 1 to 10 μm, and since the display unit 130 is stacked thereon, followed by a few exposing processes for patterning to prevent deterioration, the first polymer layer 111 may also have high heat resistance. Instead of a glass substrate, the first polymer layer 111 functions as a lower substrate, and is a very flexible thin film substrate having a thickness of about 1 to 10 μm.

The first barrier layer 112 stacked on the first polymer layer 111 is a layer having a water repellent property for the prevention of permeation of external water molecules, and may be, for example, a multi-layered film formed of SiO/SiN. That is, SiO and SiN are deposited to form a multi-layered structure, and the first barrier layer 112 having such a multi-layered structure has a water vapor transmission rate of $10^{-5}$ g/m²·day or less. That is, the first barrier layer 112 has an excellent water repellent property. The first barrier layer 112 may be formed on the first polymer layer 111 by deposition.

The second barrier layer 122 of the second flexible substrate 120 stacked on the display unit 130 is a layer having a water repellent property for the prevention of permeation of external water molecules, and may be, for example, a multi-layered film formed of SiO/SiN. That is, SiO and SiN are deposited to form a multi-layered structure, and the first barrier layer 112 having such a multi-layered structure has a water vapor transmission rate of $10^{-5}$ g/m²·day or less. That is, the first barrier layer 112 has an excellent water repellent property.

The second polymer layer 121 formed on the second barrier layer 122 may be formed of a transparent polyimide having a glass transition temperature of 350° C. or more. The transparent polyimide may be a polymer of one or more selected from a dianhydride monomer, a diamine monomer, and an amide monomer. For example, the transparent polyimide may be a polymer of a dianhydride monomer and a diamine monomer, or a polymer of a dianhydride monomer and an amide monomer. Unlimiting examples of the dianhydride monomer are pyromellitic dianhydride (PMDA), 1,2,3,4-cyclobutanetetracarboxylic dianhydride (CBDA), and the like. An unlimiting example of the diamine monomer is trans-1,4-cyclohexanediamine (CHDA). An unlimiting example of the amide monomer is hexamethylphosphoramide (HMPA). Since the flexible organic light-emitting display device 100 is a top emission type display device, an image embodied by the display unit 130 may be viewed on the side of the second polymer layer 121. Accordingly, the second polymer layer 121 needs to be a transparent layer that allows the image embodied by the display unit 130 to pass therethrough. Although a transparent polymer has a lower heat resistance than that of the first polymer layer 111 which is not transparent, the lower heat resistance is tolerable because, unlike the first polymer layer 111, the second polymer layer 121 does not undergo a pattering process of the display unit 130. In this regard, however, when the carrier substrate 160 is separated, the second polymer layer 121 may be exposed to ultraviolet light. Accordingly, the second polymer layer 121 needs to have a glass transition temperature of 350° C. or more to prevent damage thereof. Herein, although the heat resistance of the second polymer layer 121 is relatively lower than that of the first polymer layer 111, the second polymer layer 121 is itself a heat resistance layer that endures a temperature of 350° C.

A thickness of the second polymer layer 121 may be in a range of about 1 to 10 μm. Instead of a typical glass substrate, the second polymer layer 121 functions as an upper substrate, and may be a very flexible thin film substrate having a thickness of about 1 to 10 μm.

The flexible organic light-emitting display device 100 having such a structure may be manufactured in the following processes.

Figure 2A:
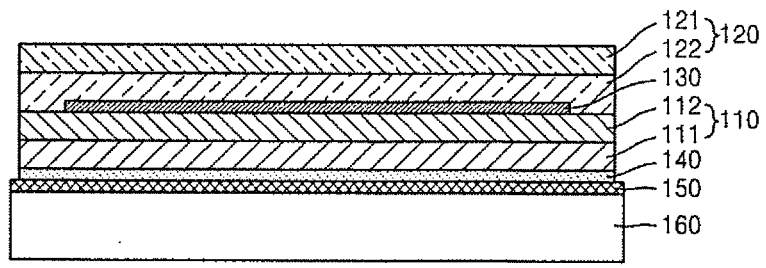
FIGS. 2A to 2C are views illustrating a method of manufacturing the flexible organic light-emitting display device of FIG. 1.
Figure 2B:
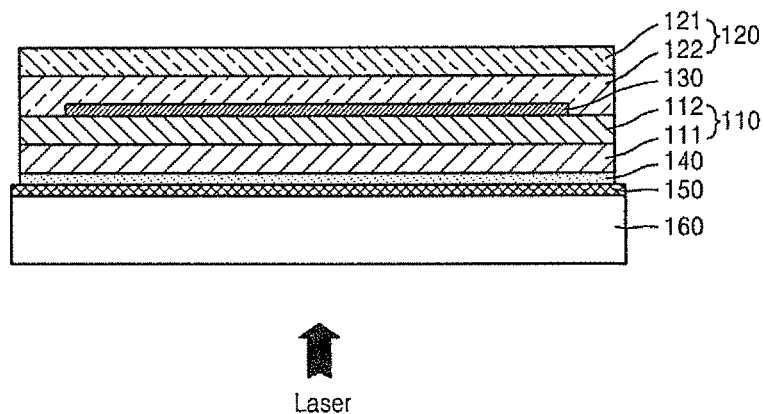
Figure 2C:
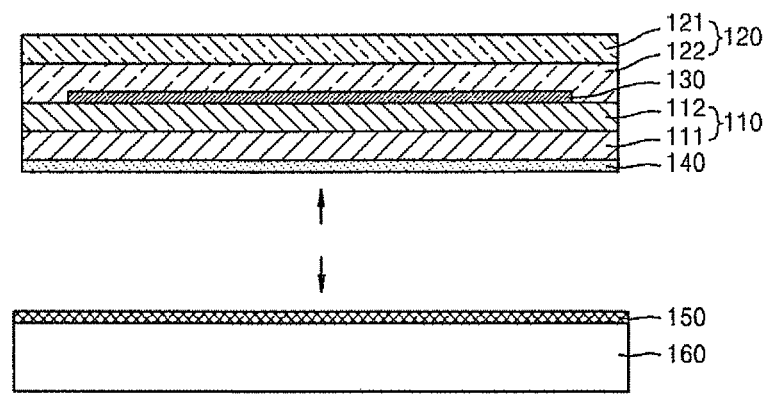
Figure 3:
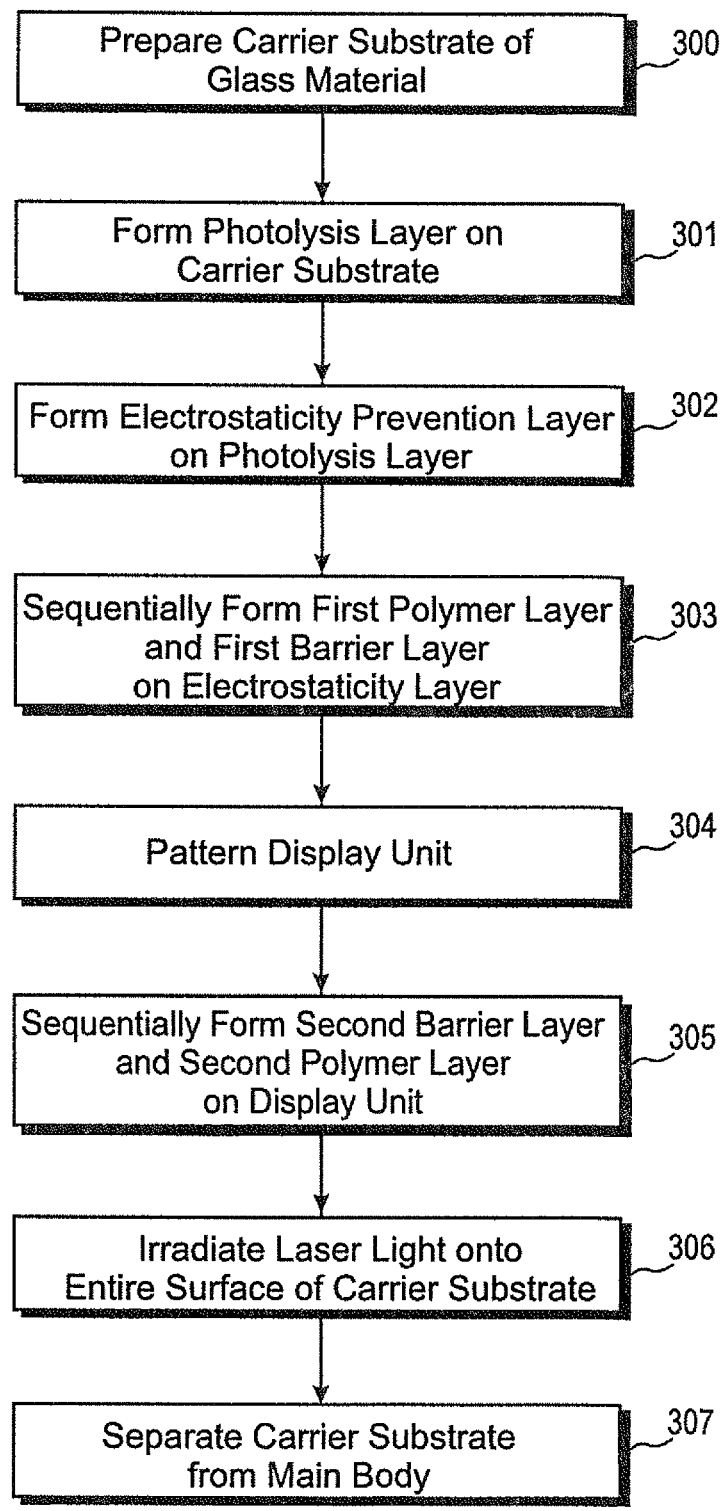
FIG. 3 is a flowchart of the method of manufacturing the flexible organic light-emitting display device of FIG. 1.

FIGS. 2A to 2C are views illustrating a method of manufacturing the flexible organic light-emitting display device of FIG. 1, and FIG. 3 is a flowchart of the method of manufacturing the flexible organic light-emitting display device of FIG. 1.

First, as illustrated in FIG. 2A, the carrier substrate 160 formed of a glass material is prepared (FIG. 3, block 300), and then, thin film layers are formed thereon.

That is, first, a photolysis layer 150 formed of polyimide having a thickness of 100 nm or less is formed on the carrier substrate 160 (FIG. 3, block 301). The photolysis layer 150 is to be decomposed due to irradiation of laser light, and may function as a sacrificial layer for removing the carrier substrate 160.

Second as the electrostaticity prevention layer 140, an amorphous ITO layer having a thickness of 200 nm or less is formed on the photolysis layer 150 (FIG. 3, block 302). That is, originally, ITO of the electrostaticity prevention layer 140 may be in an amorphous state.

Subsequently, the first polymer layer 111 and the first barrier layer 112 of the first flexible substrate 110 are sequentially formed on the electrostaticity prevention layer 140 (FIG. 3, block 303), and then, the display unit 130 is patterned (FIG. 3, block 304).

In addition, the second barrier layer 122 and the second polymer layer 121 of the second flexible substrate 120 are sequentially formed on the display unit 130 (FIG. 3, block 305).

Once such a stack structure is manufactured, laser light is irradiated onto the entire surface of the carrier substrate 160, as illustrated in FIG. 2B (FIG. 3, block 306). When irradiated, the photolysis layer 150 begins to be decomposed due to the laser light, and the amorphous ITO of the electrostaticity prevention layer 140 absorbs laser light so as to turn into crystalline ITO having low resistant characteristics. If the electrostaticity prevention layer 140 is not formed, laser light may reach up to the display unit 130, thereby damaging the thin film transistor or the emission layer. However, since the electrostaticity prevention layer 140 absorbs energy of laser light, the damage due to the laser light may be prevented.

Thereafter, as illustrated in FIG. 2C, the carrier substrate 160 is separated from a main body (FIG. 3, block 307). In this regard, when the deposition of the photolysis layer 150 is completed, the carrier substrate 160 is naturally separated from the main body. Furthermore, when the electrostaticity prevention layer 140 is not formed, electrostaticity accumulated between the carrier substrate 160 and the first polymer layer 111 may be discharged during the separation process of the carrier substrate 160, thereby damaging the display unit 130. In the present embodiment, however, this problem can be solved because the electrostaticity prevention layer 140, which has turned into a crystalline ITO layer having low resistance characteristics, prevents the accumulation of electrostaticity. That is, due to the electrostaticity prevention layer 140 having low resistance characteristics, electrostaticity disperses, instead of being accumulated between the carrier substrate 160 and the first polymer layer 111, and accordingly, when the carrier substrate 160 is separated, an electrical impact of several kV or more on the display unit 130 occurring due to the all-at-once discharging of electrostaticity accumulated on the separation surface during the separation may be prevented.

Regarding the organic light-emitting display devices 100 embodied as described above, a typical strong and thick glass substrate is replaced with the first and second flexible substrates 110 and 120 as a thin film layer. Accordingly, a flexible device may be obtained. In addition, since the first and second barrier layers 112 and 122 have a multi-layered film structure of SiO/SiN having a water vapor transmission rate of $10^{-5}$ g/m²·day or less, excellent water repellent properties may be obtained.

Also, damage of the display unit 130 due to heat or electrostaticity impacts during the irradiation of laser light or the separation of the carrier substrate 160 may be prevented by the electrostaticity prevention layer 140. In addition, since the electrostaticity prevention layer 140 prevents the accumulation of electrostaticity even during use of a final product, damages due to electrostaticity during use may be prevented.

Also, in the present embodiment, materials for forming the first and second flexible substrates 110 and 120, respectively, are not glass. However, as in an flexible organic light-emitting display device according to another embodiment of the present invention, a thin glass substrate having a thickness of 0.1 mm or less may be used as a first flexible substrate. That is, a glass substrate having a thickness of 0.1 mm or less is so thin that the glass substrate has flexible bending characteristics, although the glass substrate is formed of glass. Accordingly, a flexible organic light-emitting display device, including a first flexible substrate that is a thin glass substrate, may be embodied.

Figure 4:
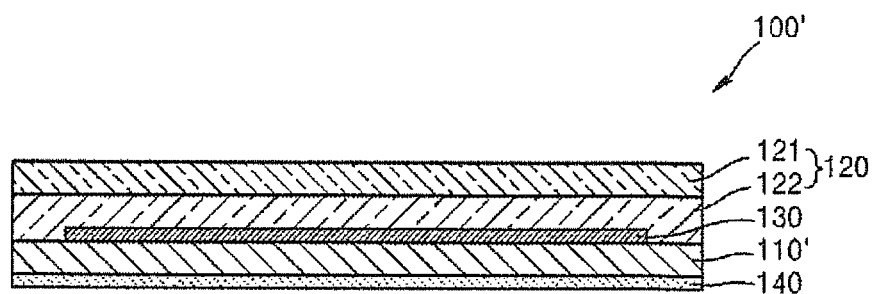
FIG. 4 is a cross-sectional view of a flexible organic light-emitting display device according to another embodiment of the present invention.
Figure 5A:
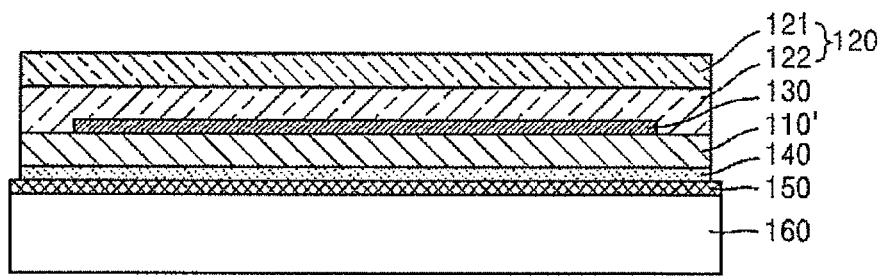
FIGS. 5A to 5C are views illustrating a method of manufacturing the flexible organic light-emitting display device of FIG. 4.
Figure 5B:
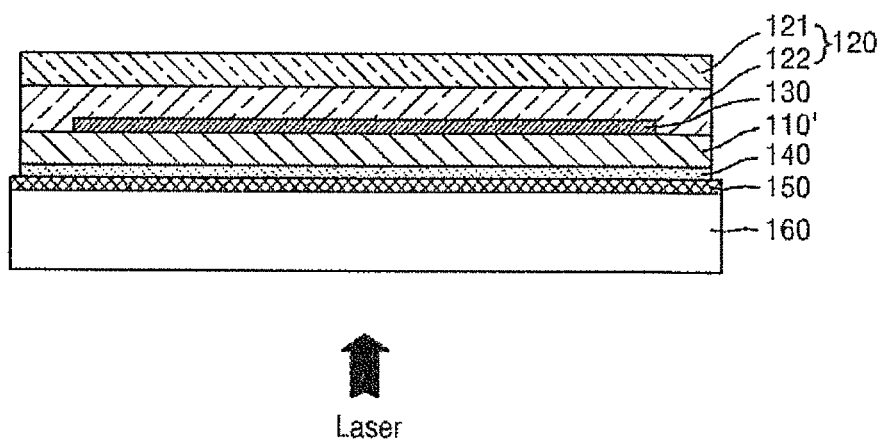
Figure 5C:
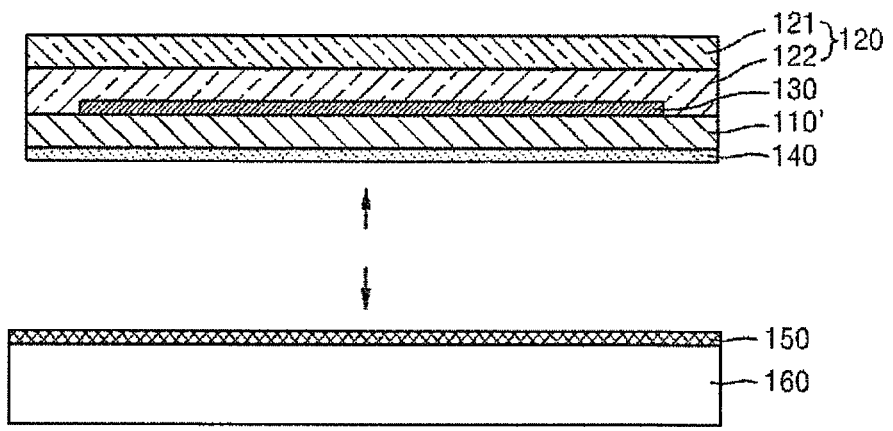
Figure 6:
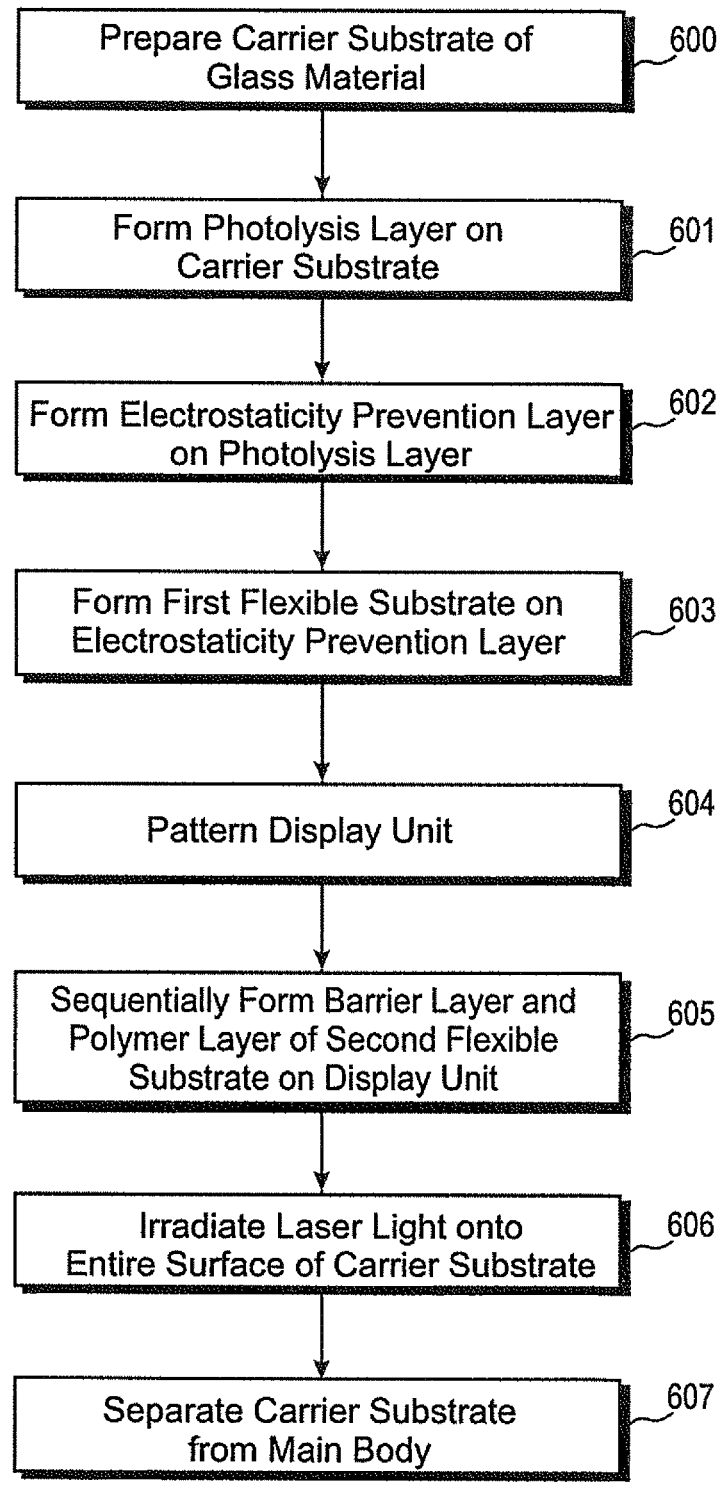
FIG. 6 is a flowchart of the method of manufacturing the flexible organic light-emitting display device of FIG. 4.

FIG. 4 is a cross-sectional view of a flexible organic light-emitting display device according to another embodiment of the present invention, FIGS. 5A to 5C are views illustrating a method of manufacturing the flexible organic light-emitting display device of FIG. 4, and FIG. 6 is a flowchart of the method of manufacturing the flexible organic light-emitting display device of FIG. 4.

The flexible organic light-emitting display device 100' of FIG. 4 according to the present embodiment may be manufactured in the following processes.

First, as illustrated in FIG. 5A, the carrier substrate 160 formed of a glass material is prepared (FIG. 6, block 600), and then thin film layers are formed thereon.

That is, first, the photolysis layer 150 formed of polyimide having a thickness of 100 nm or less is formed on the carrier substrate 160 (FIG. 6, block 601). The photolysis layer 150 is to be decomposed due to irradiation of laser light, and may function as a sacrificial layer for removing the carrier substrate 160.

Second, as the electrostaticity prevention layer 140, an amorphous ITO layer having a thickness of 200 nm or less is formed on the photolysis layer 150 (FIG. 6, block 602). That is, originally, ITO of the electrostaticity prevention layer 140 may be in an amorphous state.

Subsequently, a glass substrate having a thickness of 0.1 mm or less, which is the first flexible substrate 110', is formed on the electrostaticity prevention layer 140 (FIG. 6, block 603), and then the display unit 130 is patterned (FIG. 6, block 604).

In addition, the barrier layer 122 and the polymer layer 121 of the second flexible substrate 120 are sequentially formed on the display unit 130 (FIG. 6, block 605).

Once such a stack structure is manufactured, as illustrated in FIG. 4B, laser light is irradiated onto the entire surface of the carrier substrate 160 (FIG. 6, block 606). When irradiated, the photolysis layer 150 begins to be decomposed due to the laser light, and the amorphous ITO of the electrostaticity prevention layer 140 absorbs laser light so as to turn into crystalline ITO having low resistant characteristics. If the electrostaticity prevention layer 140 is not formed, laser light may reach up to the display unit 130, thereby damaging the thin film transistor or the emission layer. However, since the electrostaticity prevention layer 140 absorbs energy of laser light, damage due to the laser light may be prevented.

Thereafter, as illustrated in FIG. 4C, the carrier substrate 160 is separated from a main body (FIG. 6, block 607). In this regard, when the deposition of the photolysis layer 150 is completed, the carrier substrate 160 is naturally separated from the main body. In this regard, when the electrostaticity prevention layer 140 is not formed, electrostaticity accumulated between the carrier substrate 160 and the first polymer layer 110 may be discharged during the separation process of the carrier substrate 160, thereby damaging the display unit 130. In the present embodiment, however, this problem can be solved because the electrostaticity prevention layer 140, which has turned into a crystalline ITO layer having low resistance characteristics, prevents the accumulation of electrostaticity. That is, due to the electrostaticity prevention layer 140 having low resistance characteristics, electrostaticity disperses, instead of being accumulated between the carrier substrate 160 and the first polymer layer 110, and accordingly, when the carrier substrate 160 is separated, an electrical impact of several kV or more on the display unit 130 occurring due to the all-at-once discharging of electrostaticity accumulated on the separation surface during the separation may be prevented.

Regarding the organic light-emitting display devices 100' according to the present embodiment, a typical strong and thick glass substrate is replaced with the very thin first flexible substrates 110' and the second flexible substrate 120. Accordingly, a flexible device may be obtained. In addition, since the second barrier layer 122 has a multi-layered film structure of SiO/SiN having a water vapor transmission rate of $10^{-5}$ g/m$^2$·day or less, excellent water repellent properties may be obtained.

Also, damage of the display unit 130 due to heat or electrostaticity impacts during the irradiation of laser light or the separation of the carrier substrate 160 may be prevented by the electrostaticity prevention layer 140. In addition, since the electrostaticity prevention layer 140 prevents the accumulation of electrostaticity even during use of a final product, damage due to electrostaticity during use may be prevented.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A method of manufacturing a flexible organic light-emitting display device, the method comprising the steps of:
    sequentially forming a photolysis layer and an electrostaticity prevention layer on a carrier substrate;
    forming a first flexible substrate on the electrostaticity prevention layer;
    forming a display unit on the first flexible substrate;
    covering the display unit with a second flexible substrate; and
    irradiating light to decompose the photolysis layer and to remove the carrier substrate.

2. The method of claim 1, further comprised of the photolysis layer comprising a polyimide layer.

3. The method of claim 2, further comprised of the polyimide layer having a thickness not greater than 100 nm.

4. The method of claim 1, further comprised of the electrostaticity prevention layer comprising an ITO layer.

5. The method of claim 4, further comprised of, before the irradiating of light, the ITO layer being an amorphous ITO layer, and after the irradiating of light, the ITO layer turning into a crystalline ITO layer.

6. The method of claim 4, further comprised of the ITO layer having a thickness not greater than 200 nm.

7. The method of claim 1, further comprised of the first flexible substrate comprising a first polymer layer and a first barrier layer which are sequentially stacked, and the second flexible substrate comprising a second barrier layer and a second polymer layer which are sequentially stacked.

8. The method of claim 1, further comprised of the first flexible substrate comprising a glass substrate having a thickness not greater than 0.1 mm, and the second flexible substrate comprising a barrier layer and a polymer layer which are sequentially stacked.

9. A flexible organic light-emitting display device manufactured by the method of claim 1.

* * * * *